(12) United States Patent
Kim et al.

(10) Patent No.: US 8,581,198 B2
(45) Date of Patent: Nov. 12, 2013

(54) APPARATUS AND METHOD FOR DETECTING RADIATION

(75) Inventors: Jung-Seok Kim, Gwangju-si (KR); Byung-Hun Ko, Seongnam-si (KR); Beom-Jin Moon, Suwon-si (KR); Jung-Kee Yoon, Anyang-si (KR)

(73) Assignee: Drtech Corporation, Seongnam-si (KR)

( * ) Notice: Subject to any disclaimer, the term of this patent is extended or adjusted under 35 U.S.C. 154(b) by 423 days.

(21) Appl. No.: 12/957,807

(22) Filed: Dec. 1, 2010

(65) Prior Publication Data

US 2012/0080603 A1    Apr. 5, 2012

(30) Foreign Application Priority Data

Sep. 30, 2010  (KR) .................. 10-2010-0095571

(51) Int. Cl.
*H01L 25/00*    (2006.01)
(52) U.S. Cl.
USPC .............................. 250/370.08; 250/370.01
(58) Field of Classification Search
USPC ............. 250/370.01, 370.08, 370.09
See application file for complete search history.

(56) References Cited

U.S. PATENT DOCUMENTS

| 4,286,033 A * | 8/1981 | Neyhart et al. ............. 430/58.6 |
| 7,488,966 B2 | 2/2009 | Noda et al. |

FOREIGN PATENT DOCUMENTS

| JP | 2000-287034 | 10/2000 |
| JP | 2005-033002 | 2/2005 |
| JP | 2005-268722 | 9/2005 |
| JP | 2007-059798 | 3/2007 |
| KR | 10-2004-0019930 | 3/2004 |
| KR | 10-2007-0035449 | 3/2007 |
| KR | 10-2008-0056641 A | 6/2008 |
| KR | 10-2010-0011101 | 2/2010 |

\* cited by examiner

*Primary Examiner* — David Porta
*Assistant Examiner* — Faye Boosalis
(74) *Attorney, Agent, or Firm* — NSIP Law

(57) ABSTRACT

An apparatus and method for detecting radiation, which can improve the resolution of a radiation image and contribute to the simplification of the manufacture of the apparatus, are provided. The apparatus includes an upper electrode layer transmitting radiation; a first photoconductive layer becoming photoconductive upon exposure to the radiation and thus generating charges therein; a charge trapping layer trapping therein the charges generated in the first photoconductive layer and serving as a floating electrode; a second photoconductive layer becoming photoconductive upon exposure to rear light for reading out a radiation image; a lower transparent electrode layer charged with the charges trapped in the charge trapping layer; a rear light emission unit applying the rear light to the second photoconductive layer via the lower transparent electrode layer in units of pixels; and a data processing unit reading out a signal corresponding to the charges trapped in the charge trapping layer from the lower transparent electrode layer and generating a radiation image based on the read-out signal.

10 Claims, 17 Drawing Sheets

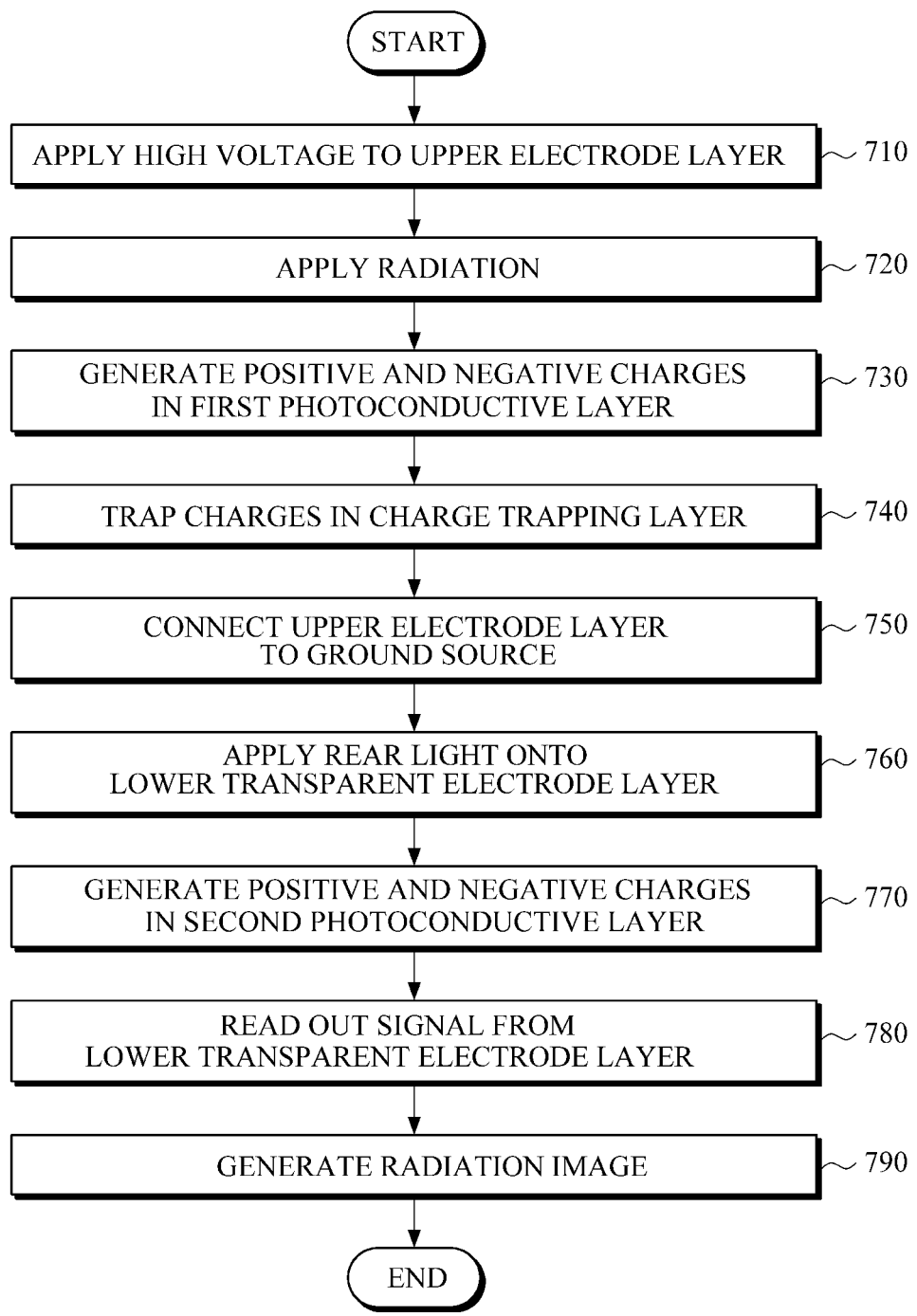

APPARATUS AND METHOD FOR DETECTING RADIATION

CROSS-REFERENCE TO RELATED APPLICATION(S)

This application claims the benefit under 35 U.S.C. §119(a) of Korean Patent Application No. 10-2010-0095571, filed on Sep. 30, 2010, in the Korean Intellectual Property Office, the entire disclosure of which is incorporated herein by reference for all purposes.

BACKGROUND

1. Field

The following description relates to an apparatus and method for detecting radiation, which can detect radiation such as X-rays and can thus generate image data 2. Description of the Related Art Digital radiation detection apparatuses are devices that obtain information on the inside of the human body through X-ray irradiation without a requirement of films, detect electric image signals from the obtained information with the use of image detection sensors and generate a digital image based on the electrical image signals. Digital radiation detection apparatuses are largely classified into direct-type and indirect-type digital radiation detection apparatuses. Direct-type digital radiation detection apparatuses directly detect electric signals generated by irradiating the human body using amorphous selenium (a-Se) and thin film transistors (TFTs). Indirect-type digital radiation detection apparatuses use light receptors such as charge-coupled deices (CCDs) or photodiodes and thus obtain radiation images from light emitted by phosphors (such as CsI) that convert radiation into visible light. Indirect-type digital radiation detection apparatuses have a relatively low resolution, compared to direct-type digital radiation detection apparatuses.

Conventional radiation detection apparatuses using TFTs are likely to result in a considerable amount of noise. The greater the size of radiation detection apparatuses, the greater the amount of noise generated, and the lower the detective quantum efficiency. In addition, since a TFT is required for each pixel in a panel, radiation detection apparatuses are generally difficult and costly to manufacture on a large scale.

SUMMARY

The following description relates to an apparatus and method for detecting radiation, which can improve the resolution of radiation images and can contribute to the simplification of the manufacture of the apparatus.

In one general aspect, there is provided an apparatus for detecting radiation, the apparatus including an upper electrode layer transmitting radiation; a first photoconductive layer becoming photoconductive upon exposure to the radiation and thus generating charges therein; a charge trapping layer trapping therein the charges generated in the first photoconductive layer and serving as a floating electrode; a second photoconductive layer becoming photoconductive upon exposure to rear light for reading out a radiation image; a lower transparent electrode layer charged with the charges trapped in the charge trapping layer; and a rear light emission unit applying the rear light to the second photoconductive layer via the lower transparent electrode layer in units of pixels.

In another general aspect, there is provided a method of detecting radiation, which is performed by an apparatus for detecting radiation, including an upper electrode layer transmitting radiation, a first photoconductive layer becoming photoconductive upon exposure to the radiation and thus generating charges therein, a charge trapping layer trapping therein the charges generated in the first photoconductive layer and serving as a floating electrode, a second photoconductive layer becoming photoconductive upon exposure to rear light for reading out a radiation image, a lower transparent electrode layer charged with the charges trapped in the charge trapping layer, and a rear light emission unit applying the rear light to the second photoconductive layer via the lower transparent electrode layer in units of pixels, the method including generating pairs of positive and negative charges in the first photoconductive layer upon exposure to radiation when applying a high voltage to the upper electrode layer; separating the positive and negative charges from each other and moving the positive and negative charges toward the upper electrode layer and the charge trapping layer, respectively; trapping the positive or negative charges in the charge trapping layer; connecting the upper electrode layer to a ground source and generating pairs of positive and negative charges in the second photoconductive layer upon exposure to the rear light; and reading out a signal corresponding to the charges trapped in the charge trapping layer from the lower transparent electrode layer, the charges trapped in the charge trapping layer originating from the second photoconductive layer.

Other features and aspects may be apparent from the following detailed description, the drawings, and the claims.

BRIEF DESCRIPTION OF THE DRAWINGS

FIG. 7 is a flowchart of an exemplary method of detecting radiation.

Figure 1:
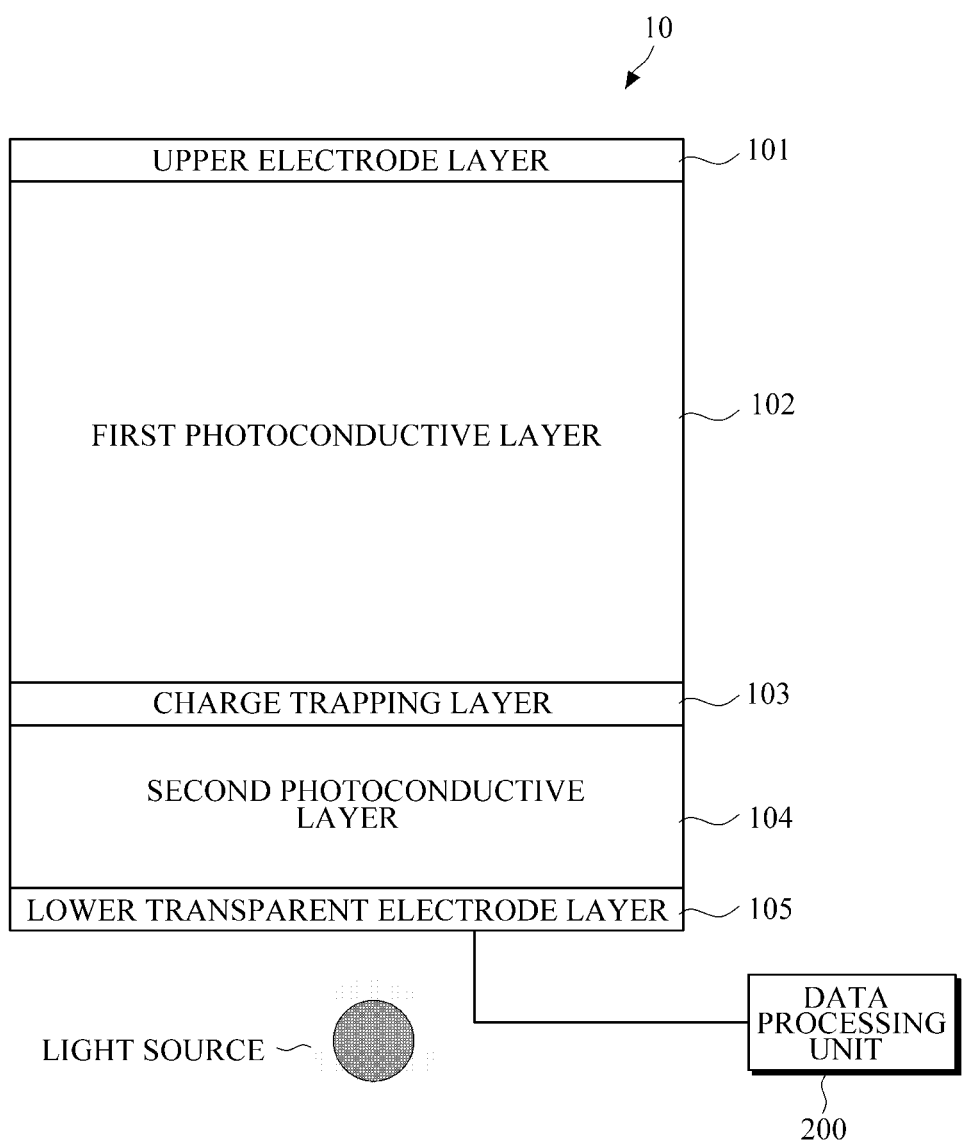
FIG. 1 is a cross-sectional view of an exemplary apparatus for detecting radiation.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

FIG. 1 is a cross-sectional view of an exemplary apparatus 10 for detecting radiation. Referring to FIG. 1, the apparatus 10 may include an upper electrode layer 101, a first photoconductive layer 102, a charge trapping layer 103, a second photoconductive layer 104, a lower transparent electrode layer 105 and a data processing unit 200. The upper electrode layer 101 may transmit radiation incident thereupon from an external source to the first photoconductive layer 102. Examples of the radiation include, but are not limited to X-rays, alpha rays and gamma rays.

The first photoconductive layer 102 may become photoconductive upon exposure to the radiation transmitted thereto by the upper electrode layer 101. That is, the first photoconductive layer 102 may generate pairs of positive and negative charges (i.e., holes and electrons) upon exposure to radiation. The amount of charges generated by the first photoconductive layer 102 may be proportional to the intensity of radiation transmitted to the first photoconductive layer 102. The amount of radiation that reaches the first photoconductive layer 102 may vary according to the composition of an object (such as the human body), if any, placed on the upper electrode layer 101. The first photoconductive layer 102 may be formed of amorphous selenium (a-Se), $As_2Se_3$ or an asbestos (As)-contained a-Se compound.

The charge trapping layer 103 may trap therein the positive and negative charges generated in the first photoconductive layer 102, and may thus serve as a floating electrode.

More specifically, the charge trapping layer 103 may block the charges collected from the first photoconductive layer 102 and accumulated between the first photoconductive layer 102 and the charge trapping layer 103. The charge trapping layer 103 may include a metal layer, a dielectric layer or the combination thereof.

The second photoconductive layer 104 may become photoconductive upon exposure to rear light for reading out a radiation image. The second photoconductive layer 104 may generate pairs of positive and negative charges upon exposure to rear light. The amount of positive and negative charges generated in the second photoconductive layer 104 may be proportional to the intensity of rear light transmitted to the second photoconductive layer 104. The second photoconductive layer 124 may be formed of a-Se, $As_2Se_3$ or an As-contained a-Se compound.

The term 'rear light,' as used herein, indicates light irradiated from an opposite side of the apparatus 10 with respect to the direction of radiation. Examples of a rear light source include, but are not limited to, various light source systems capable of applying light in units of pixels, such as a liquid crystal display (LCD), a plasma display panel (PDP), a light-emitting diode (LED), a field emission display (FED), and a laser light source.

The lower transparent electrode layer 105 may be charged with the charges trapped in the charge trapping layer 103. The lower transparent electrode layer 105 may be formed of a transparent material and may thus be able to transmit rear light therethrough to the second photoconductive layer 104. More specifically, the lower transparent electrode layer 105 may be formed of a transparent material such as indium tin oxide (ITO) or indium zinc oxide (IZO). Once pairs of positive and negative charges are generated in the second photoconductive layer 104, the lower transparent electrode layer 105 may be charged with the opposite polarity to that of the charges trapped in the charge trapping layer 103.

The data processing unit 200 may read out a signal corresponding to the charges in the lower transparent electrode layer 105 and may thus generate a radiation image. FIG. 1 illustrates the structure of a portion of the apparatus 10 corresponding to a pixel. Thus, the data processing unit 200 may perform the reading out of the signal in units of pixels or rows or columns of pixels in a pixel array in the apparatus 10 and may thus obtain a whole radiation image.

Figure 2:
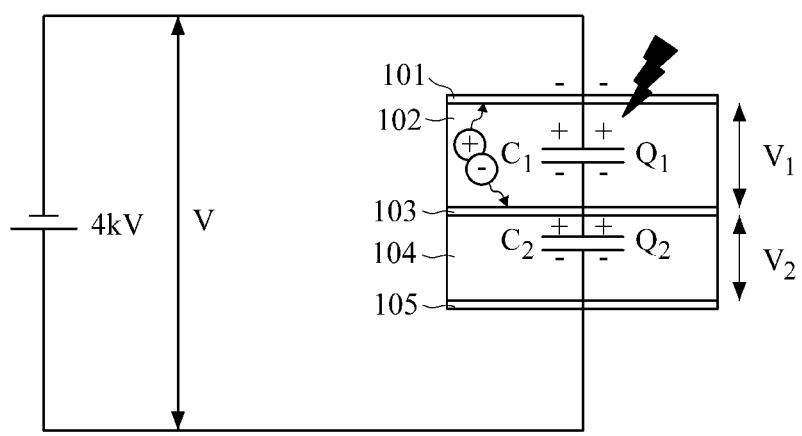
FIG. 2 is a circuit diagram for explaining the operation of first and second photoconductive layers shown in FIG. 1.

FIG. 2 is a circuit diagram for explaining the operation of the first and second photoconductive layers 102 and 104, which are stacked with the charge trapping layer 103 interposed therebetween. Referring to FIG. 2, when radiation is transmitted to the first photoconductive layer 102 by the upper electrode layer 101, pairs of positive and negative charges may be generated in the first photoconductive layer 102. An electric field may be generated in the upper electrode layer 101 in response to a high voltage of, for example, 4 kV, applied to the upper electrode layer 101. Then, the positive and negative charges in the first photoconductive layer 102 may move toward opposite directions. As a result, positive or negative charges may be trapped in the charge trapping layer 103. More specifically, if a negative voltage is applied to the upper electrode layer 101, the positive charges in the first photoconductive layer 102 may move toward the upper electrode layer 101, whereas the negative charges in the photoconductive layer 102 may move toward the charge trapping layer 103.

Referring to FIG. 2, the first and second photoconductive layers 102 and 104, which are stacked with the charge trapping layer 103 interposed therebetween, may serve as capacitors connected in series. The relationship between capacitance C and energy W may be defined by the following equation:

$$W = \frac{1}{2}CV^2.$$

Since a charge quantity $Q_1$ of the first photoconductive layer 102 is the same as a charge quantity $Q_2$ of the second photoconductive layer 104, $$\frac{1}{2}C_1V_1^2 = \frac{1}{2}C_2V_2^2$$

where $C_1$ and $C_2$ respectively indicate the capacitances of the first and second photoconductive layers 102 and 104, and $V_1$ and $V_2$ respectively indicate the voltages of the first and second photoconductive layers 102 and 104. In addition, since $$C = \varepsilon_o \frac{A}{d}$$

and V=Ed, $$\frac{1}{2}\varepsilon_o AE_1^2 d_1 = \frac{1}{2}\varepsilon_o AE_2^2 d_2$$

where $d_1$ and $d_2$ respectively indicate the thicknesses of the first and second photoconductive layers 102 and 104 and $E_1$ and $E_2$ respectively indicate the electric fields applied to the first and second photoconductive layers 102 and 104. The thickness $d_1$ of the first photoconductive layer 102 may be much greater than the thickness $d_2$ of the second photoconductive layer 104. For example, the thickness $d_1$ of the first photoconductive layer 102 may be about 500 µm, and the thickness $d_2$ of the second photoconductive layer 104 may be about 7-12 µm. Thus, the magnitude of the electric field $E_2$ applied to the second photoconductive layer 104 may be greater than the magnitude of the electric field $E_1$ applied to the first photoconductive layer 102. During an image recording operation, a high voltage may be applied to the upper electrode layer 101, whereas, during a radiation image read-out operation, a ground voltage may be applied to the upper electrode layer 101. Therefore, most of the electric field generated in the apparatus 10 may be applied to the second photoconductive layer 104.

Referring to FIG. 2, the charges (regardless of whether positive or negative) generated in the first photoconductive layer 102 may be blocked by an energy barrier between the charge trapping layer 103 and the first photoconductive layer 102. Even when blocked by the charge trapping layer 103, electrons can jump over the energy barrier if the energy barrier becomes low due to, for example, a variation in the electric field or temperature outside the charge trapping layer 103. However, since the electric field applied to the first photoconductive layer 102 is much weaker than the electric field applied to the second photoconductive layer 104, there is no sufficient external energy for the charges generated in the first photoconductive layer 102 to jump over the energy barrier. Thus, the charges generated in the first photoconductive layer 102 can be effectively blocked by the charge trapping layer 103.

If rear light is applied to the second photoconductive layer 104 when the negative charges are blocked by the charge trapping layer 103, pairs of positive and negative charges may be generated in the second photoconductive layer 104. In this case, the positive charges in the second photoconductive layer 104 may move toward the charge trapping layer 103, and thus, the surface of the charge trapping layer 103 may be electrically neutralized. The negative charges in the second photoconductive layer 104 may move toward the lower transparent electrode layer 105 and may thus be subjected to a radiation image read-out operation. In short, the negative charges trapped in the charge trapping layer 103 may be read out, and image processing may be performed on the read-out negative charges, thereby obtaining a radiation image.

The energy band at the interface between the charge trapping layer 103 and the first photoconductive layer 102 may depend on the difference between the work function of a conductive material of the charge trapping layer 103 and the work function of the first photoconductive layer 102, and may be adjusted according to the physical properties of the charge trapping layer 103 and the first photoconductive layer 102 such as thickness and specific resistance.

In order to properly trap charges in the charge trapping layer upon exposure to radiation, the charge trapping layer 103 may be formed as a metal layer, a dielectric layer or the combination thereof. More specifically, the charge trapping layer 103 may be formed as a metal layer by using silver (Ag), copper (Cu), gold (Au), aluminum (Al), calcium (Ca), tungsten (W), zinc (Zn), nickel (Ni), iron (Fe), platinum (Pt), tin (Sn), lead (Pb), manganese (Mn), constantan, mercury (Hg), nichrome, carbon (C), germanium (Ge), silicon (Si), glass, quartz, polyethylene terephtalate (PET), or Teflon. Alternatively, the charge trapping layer 123 may be formed as a dielectric layer by using an organic dielectric material such as benzocyclobutene (BCB), parylene, a-C:H(F), polyimide (PI), polyarylene ether, or fluorinated amorphous carbon, an inorganic dielectric material such as $SiO_2$, $Si_3N_4$, polysilsequioxane, or methyl silane, or a porous dielectric material such as xetogel/aerogel or polycaprolactone (PCL). By forming the charge trapping layer 103 as a metal layer, a dielectric layer or the combination thereof, it is possible to simplify the fabrication of the charge trapping layer 103, effectively trap the charges generated in the first photoconductive layer 102 in the charge trapping layer 103 and reduce the time and cost required to manufacture the apparatus 10, compared to the case when the charge trapping layer 103 is formed of doped semiconductor. Thus, it is possible to improve the resolution of a radiation image and simplify the manufacture of the apparatus 10.

Figure 3:
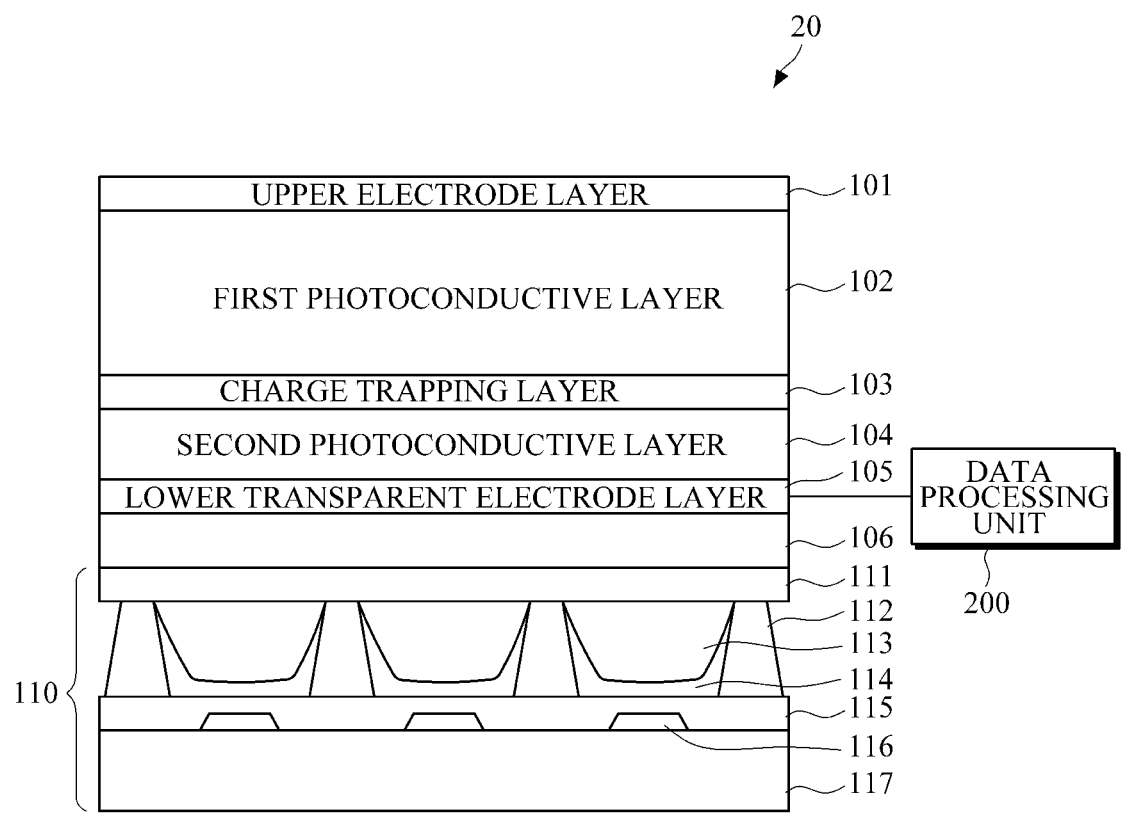
FIG. 3 is a cross-sectional view of another exemplary apparatus for detecting radiation, which uses a plasma display panel (PDP)

FIG. 3 is a cross-sectional view of another exemplary apparatus 20 for detecting radiation, which uses a plasma display panel (PDP). Referring to FIG. 3, the apparatus 20 may include an upper electrode layer 101, a first photoconductive layer 102, a charge trapping layer 103, a second photoconductive layer 104, a lower transparent electrode layer 105, an intermediate substrate 106 and a PDP 110. The PDP 110, the lower transparent electrode layer 105, the second photoconductive layer 104, the charge trapping layer 103, the first photoconductive layer 102, and the upper electrode layer 101 may be sequentially stacked. The intermediate substrate 106 may support the upper electrode layer 101, the first photoconductive layer 102, the charge trapping layer 103, the second photoconductive layer 104 and the lower transparent electrode layer 105, and may be formed of, for example, glass.

The upper electrode layer 101, the first photoconductive layer 102, the charge trapping layer 103, the second photoconductive layer 104, and the lower transparent electrode layer 105 are the same as their respective counterparts shown in FIG. 1, and thus, detailed descriptions thereof will be omitted.

The PDP 110 may provide plasma light as rear light. The PDP 110 may include a first substrate 111, a plurality of barrier ribs 112, a gas layer 113, a plurality of phosphor layers 114, an insulating layer 115, a plurality of electrodes 116 and a second substrate 117.

The first and second substrates 111 and 112 may face each other.

The barrier ribs 112 may define a cell structure between the first and second substrates 111 and 112. More specifically, the barrier ribs 112 may be formed between the first substrate 111 and the insulating layer 115 and may thus form a sealed cell structure. The barrier ribs 112 may define a plurality of pixels of the PDP 110. The barrier ribs 112 may prevent crosstalk between the pixels. The barrier ribs 112 may be formed in various shapes such as 2-, 6-, and 8-directional shapes according to the shape of pixels. The barrier ribs 112 may determine the resolution of the PDP 110. The barrier ribs 112 may be formed using the same method used to manufacture a typical PDP. The area and height of the barrier ribs 112 can be appropriately adjusted in order to increase the reaction area of each pixel for radiation.

The gas layer 113 may be disposed in an inner chamber within the cell structure formed by each of the barrier ribs 112, and may generate a plasma discharge. Plasma light generated by the gas layer 113 may be provided to the lower transparent electrode layer 105.

The phosphor layers 114 may reflect plasma light generated by the gas layer 113 and may thus enable high-intensity plasma light to be provided to the lower transparent electrode layer 105. The phosphor layers 114 may be formed between the insulating layer 115 and the barrier ribs 112. The phosphor layers 114 may be optional.

The insulating layer 115 may be formed on the second substrate 117 as a dielectric layer. The insulating layer 115 may prevent the electrodes 116, which are arranged in units of pixels, from being short-circuited and may also prevent a leakage current. The electrodes 116 may transmit power for generating plasma to the gas layer 113.

FIGS. 4A through 4E are cross-sectional views for explaining the operation of another exemplary apparatus 20 for detecting radiation, which includes a metal layer 103-1 as a charge trapping layer. The apparatus 30 may be the same as the apparatus 20 shown in FIG. 3 except that it includes the metal layer 103-1 formed of a metal. In FIGS. 4A through 4E, the plus sign '+' indicates a positive charge, and the negative sign '−' indicates a negative charge.

Figure 4A:
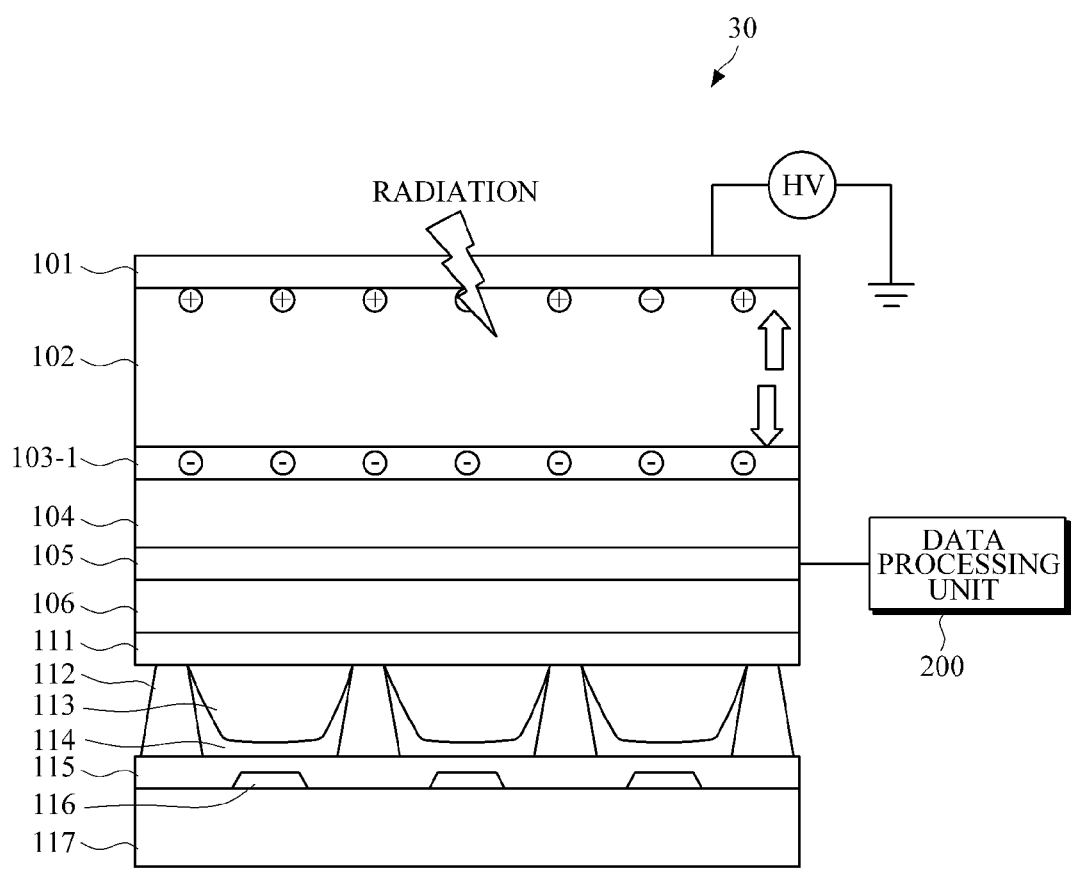
FIGS. 4A through 4E are cross-sectional views for explaining the operation of another exemplary apparatus for detecting radiation, which includes a metal layer as a charge trapping layer.
Figure 4B:
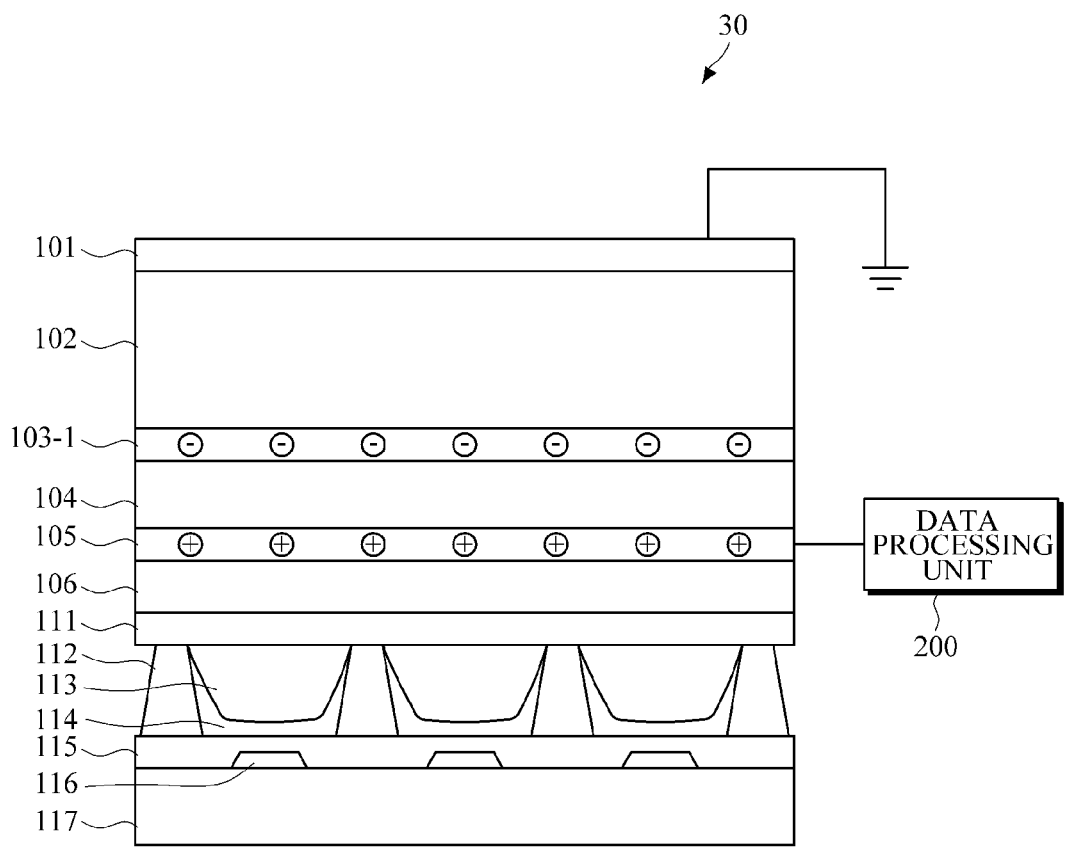

Referring to FIG. 4A, when radiation such as X-rays is applied to the apparatus 30, the radiation may be transmitted to a first photoconductive layer 102 through an upper electrode layer 101, and pairs of positive and negative charges may be generated in the first photoconductive layer 102. When a high voltage HV is applied to the upper electrode layer 101, the positive and negative charges may be separated from each other and may move toward opposite directions. More specifically, if a negative voltage is applied to the first photoconductive layer 102, the positive charges in the first photoconductive layer 102 may move toward the upper electrode layer 101, and the negative charges in the first photoconductive layer 102 may move toward the metal layer 103-1.

The negative charges moving toward the metal layer 103-1 may be trapped in the metal layer 103-1. That is, the negative charges generated in the first photoconductive layer 102 may move toward the metal layer 103-1 and may thus accumulate at the interface between the first photoconductive layer 102 and the metal layer 103-1. The negative charges accumulated between the first photoconductive layer 102 and the metal layer 103-1 can be blocked by a weak electric field applied to the first photoconductive layer 102, as described above with reference to FIG. 2. Since the amount of radiation transmitted through an object (such as the human body), if any, placed on the apparatus 30 varies according to the composition and shape of the object, the amount of positive and negative charges generated in the first photoconductive layer 102 and the amount of negative charges trapped in the metal layer 103-1 may also vary according to the composition and shape of the object. Therefore, the amount of negative charges trapped in the metal layer 103-1 may correspond to a radiation image recorded by the apparatus 30.

Once negative charges are trapped in the metal layer 103-1, a second photoconductive layer 104 can serve as a capacitor. As a result, referring to FIG. 4B, a lower transparent electrode layer 105 may be charged with positive charges. More specifically, the lower transparent electrode layer 105 may be charged with a number of positive charges corresponding to the number of negative charges trapped in the metal layer 103-1.

A radiation image read-out operation will hereinafter be described in detail. If a first row of pixels in the pixel array of a PDP 110 is turned on, plasma light may be emitted from the first row of pixels. The plasma light may transmit through the lower transparent electrode layer 105, and may thus reach the second photoconductive layer 104.

Figure 4C:
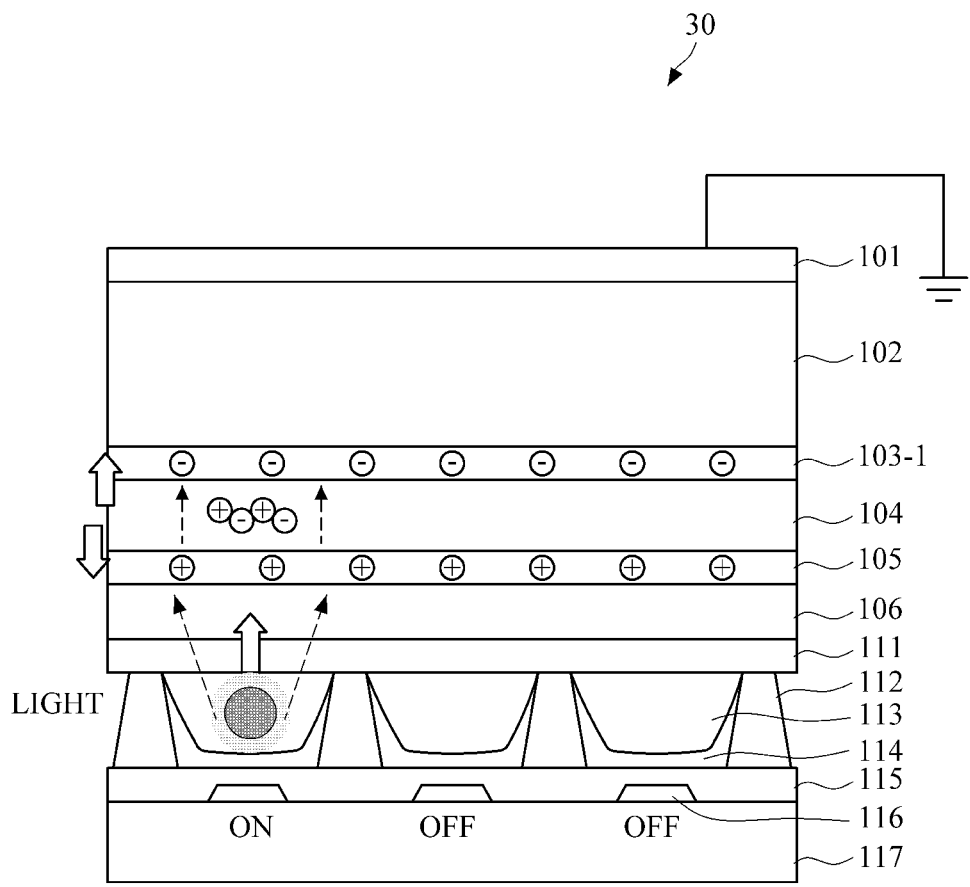

Due to the plasma light, pairs of positive and negative charges may be generated in the second photoconductive layer 104, and particularly, in a portion of the second photoconductive layer 104 corresponding to the first row of pixels. Referring to FIG. 4C, the positive charges in the second photoconductive layer 104 may be electrically attracted to the negative charges trapped in the metal layer 103-1, and the negative charges in the second photoconductive layer 104 may be electrically attracted to the positive charges in the lower transparent electrode layer 105. As a result, the positive and negative charges in the second photoconductive layer 104 may be separated from each other.

Figure 4D:
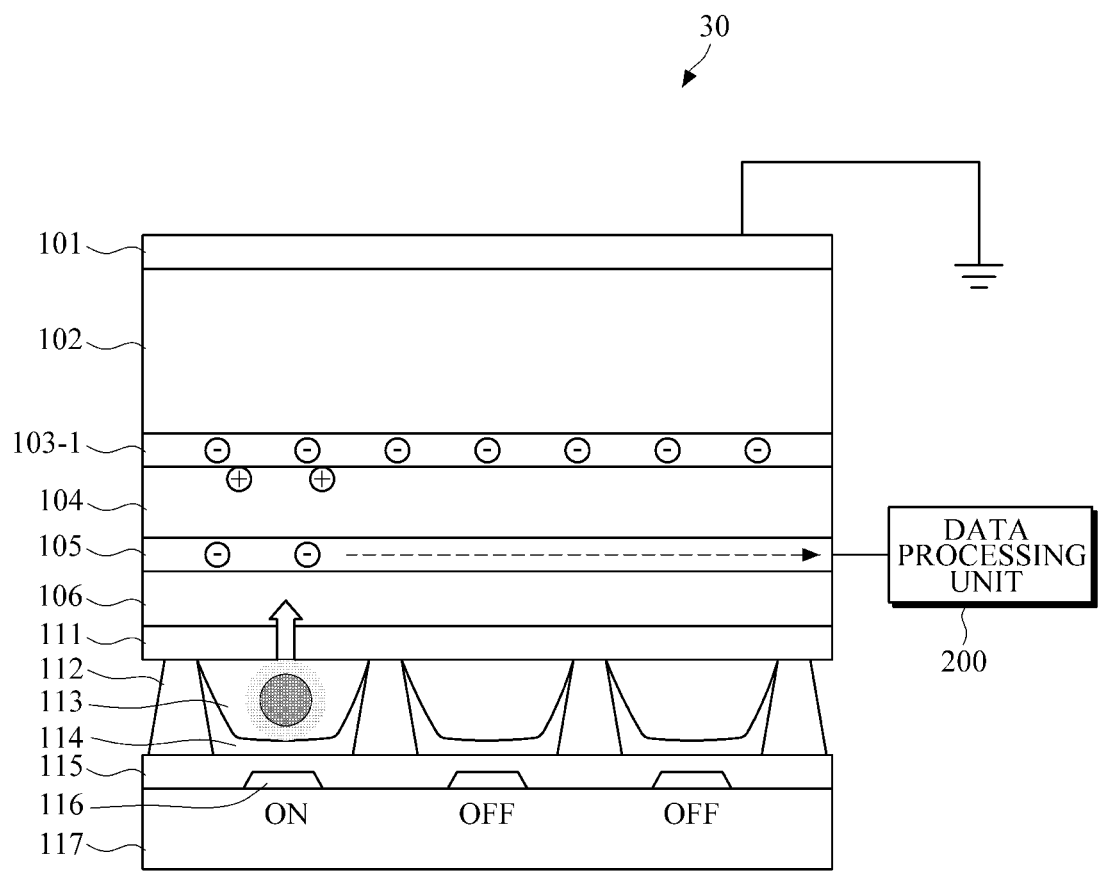

Thereafter, referring to FIG. 4D, due to the positive charges in the lower transparent electrode layer 105, the negative charges generated by the second photoconductive layer 104 may be read out from the first row of pixels by a data processing unit 200. Then, the read-out negative charges may be subjected to image processing performed by the data processing unit 200.

The positive charges generated in the second photoconductive layer 104 may move toward the metal layer 103-1 due to the negative charges trapped in the metal layer 103-1, and thus, the metal layer 103-1 may be electrically neutralized.

Figure 4E:
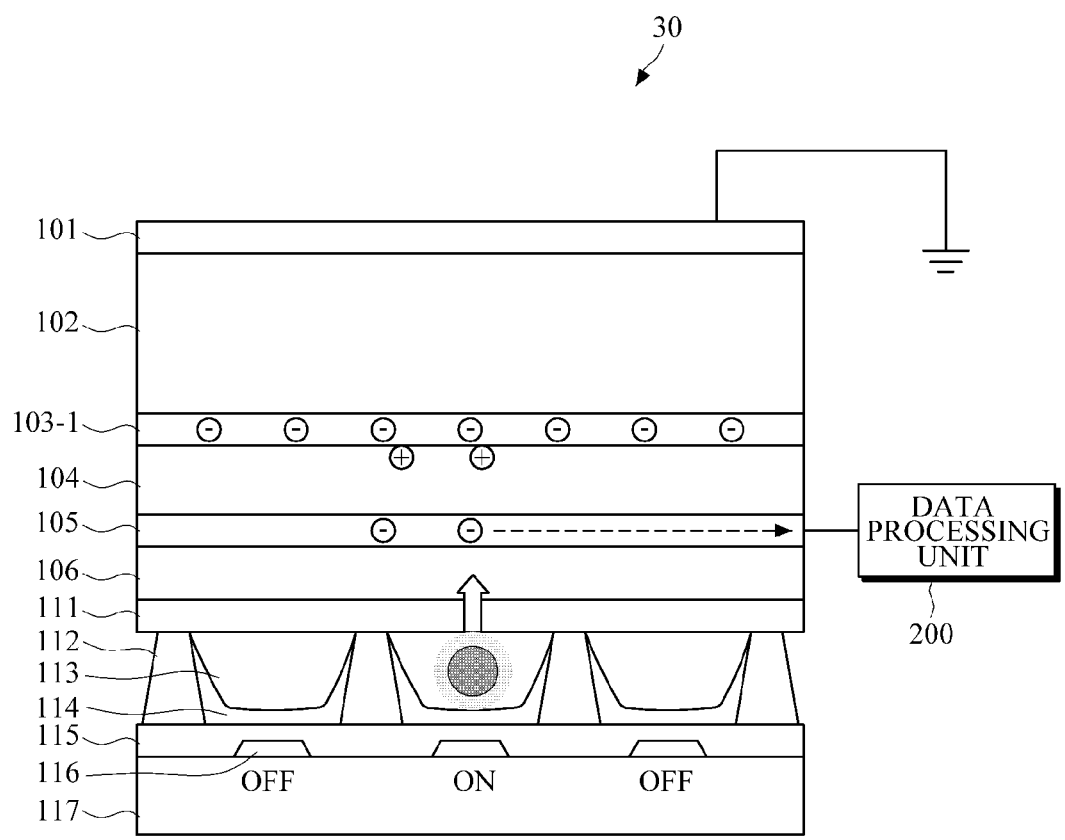

Thereafter, referring to FIG. 4E, the first row of pixels may be turned off, and a second row of pixels may be turned on. Then, the second row of pixels may emit plasma light. Due to the plasma light, pairs of positive and negative charges may be generated in a portion of the second photoconductive layer 104 corresponding to the second row of pixels. The positive and negative charges generated in the second photoconductive layer 104 may be electrically attracted to the metal layer 103-1 and the lower transparent electrode layer 105, respectively, and may thus be separated from each other. Due to the positive charges in the lower transparent electrode layer 105, negative charges may be read out from the portion of the second photoconductive layer 104 corresponding to the second row of pixels by the data processing unit 200. Then, the read-out negative charges may be subjected to image processing performed by the data processing unit 200.

Thereafter, the same operation as that performed on the first and second rows of pixels may also be performed on a third row of pixels. As a result, negative charges may be read out from a portion of the second photoconductive layer 104 corresponding to the third row of pixels by the data processing unit 200. Then, the read-out negative charges may be subjected to image processing performed by the data processing unit 200.

By performing the above-mentioned operation on all rows of pixels in the PDP 110, it is possible to obtain a radiation image of an object, if any, placed on the apparatus 30.

FIGS. 5A through 5D are cross-sectional views for explaining the operation of another exemplary apparatus 40 for detecting radiation, which includes a dielectric layer 103-2 as a charge trapping layer. The apparatus 40 is the same as the apparatus 20 shown in FIG. 3 except that it includes the dielectric material 103-2 as a charge trapping layer.

Figure 5A:
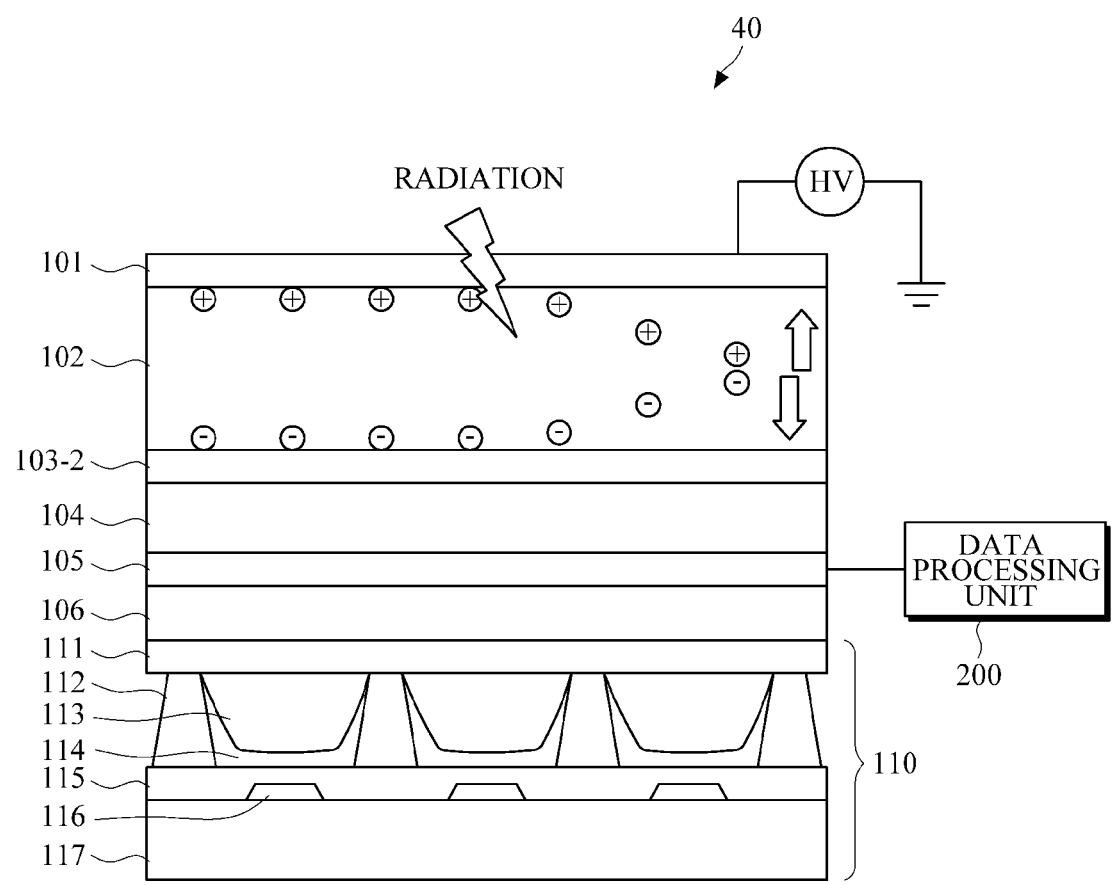
FIGS. 5A through 5D are cross-sectional views for explaining the operation of another exemplary apparatus for detecting radiation, which includes a dielectric layer as a charge trapping layer.
Figure 5B:
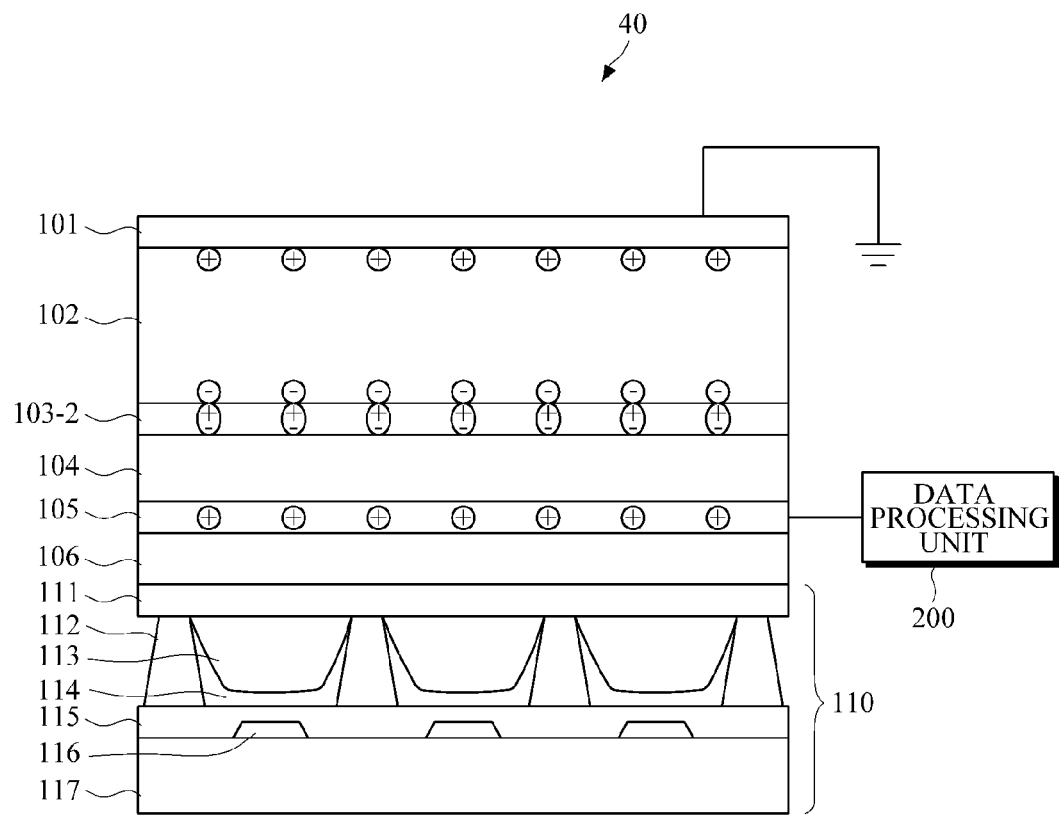

Referring to FIG. 5A, when radiation such as X-rays is applied to the apparatus 40, the radiation may be transmitted to a first photoconductive layer 102 through an upper electrode layer 101, and pairs of positive and negative charges may be generated in the first photoconductive layer 102. When a high voltage HV is applied to the upper electrode layer 101, the positive and negative charges may be separated from each other and may move toward opposite directions. More specifically, if a negative voltage is applied to the first photoconductive layer 102, the positive charges in the first photoconductive layer 102 may move toward the upper electrode layer 101, and the negative charges in the first photoconductive layer 102 may move toward the dielectric layer 103-2.

Due to the movement of the negative charges toward the dielectric layer 103-2, the dielectric layer 103-2 may be polarized, and dipoles may be generated in the dielectric layer 103-2. The dipoles in the dielectric layer 103-2 may be arranged in a manner shown in FIG. 5B.

Due to the pattern of the arrangement of the dipoles in the dielectric layer 103-2, a lower transparent electrode layer 105 may be charged with positive charges, and particularly, as many positive charges as there are dipoles in the dielectric layer 103-2.

An image read-out operation will hereinafter be described in detail.

The upper electrode layer 101 may be connected to a ground source. Then, if a first row of pixels in a PDP 110 is turned on, plasma light may be emitted from the first row of pixels. The plasma light may transmit through the lower transparent electrode layer 105 and may thus reach a second photoconductive layer 104.

Figure 5C:
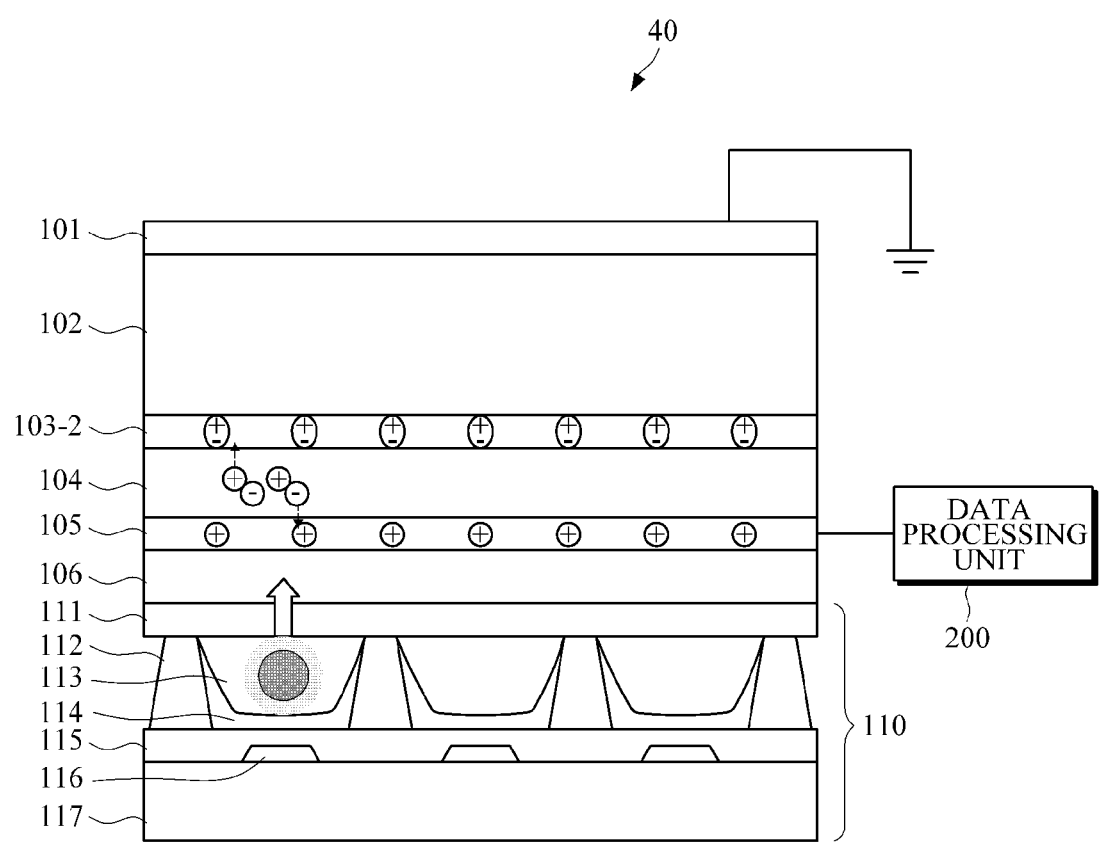

Referring to FIG. 5C, pairs of positive and negative charges may be generated in the second photoconductive layer 104, and particularly, in a portion of the second photoconductive layer 104 corresponding to the first row of pixels, upon exposure to the plasma light emitted from the first row of pixels. The positive and negative charges generated in the second photoconductive layer 104 may be electrically attracted to the dielectric layer 103-2 and the lower transparent electrode layer 105, respectively, and may thus be separated from each other.

Figure 5D:
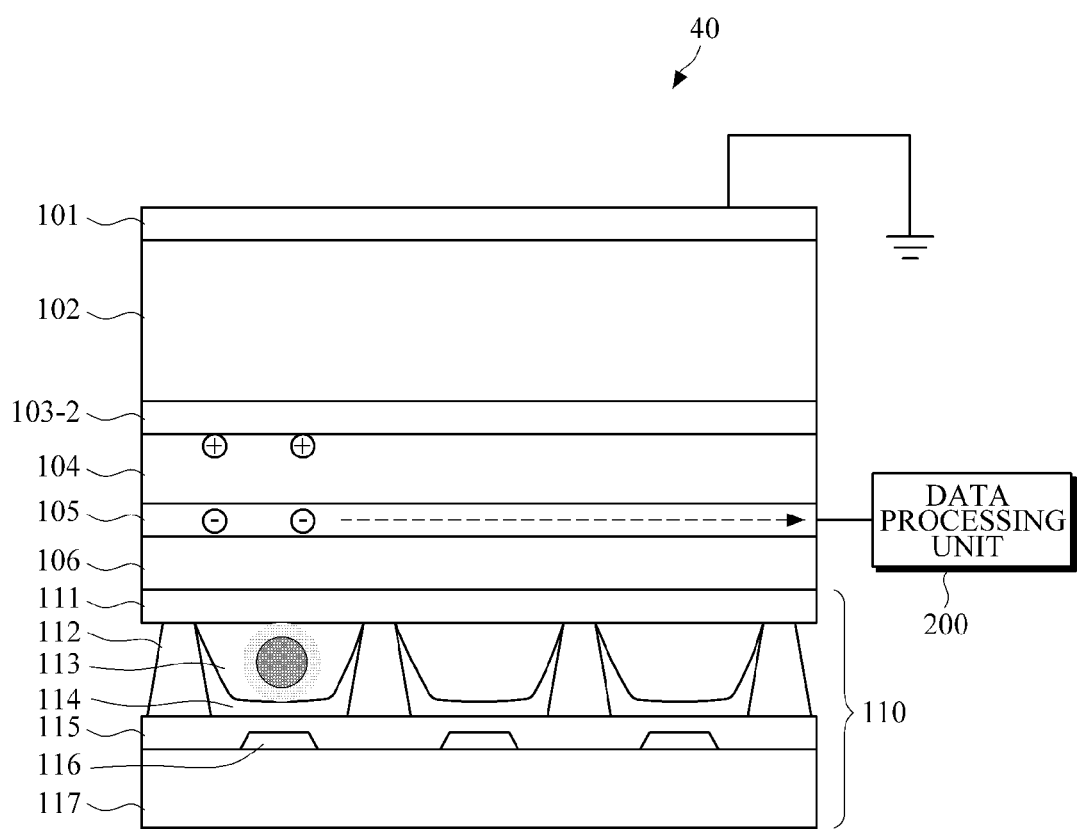

Referring to FIG. 5D, due to the positive charges in the lower transparent electrode layer 105, negative charges may be read out from the portion of the second photoconductive layer 104 corresponding to the first row of pixels by the data processing unit 200. Then, the read-out negative charges may be subjected to image processing performed by the data processing unit 200. The positive charges generated in the second photoconductive layer 104 may move toward the dielectric layer 103-2 due to the dipoles in the dielectric layer 103-2.

Thereafter, the first row of pixels may be turned off, and a second row of pixels may be turned on. Then, the second row of pixels may emit plasma light. Due to the plasma light, pairs of positive and negative charges may be generated in a portion of the second photoconductive layer 104 corresponding to the second row of pixels. The positive and negative charges generated in the second photoconductive layer 104 may be electrically attracted to the metal layer 103-1 and the lower transparent electrode layer 105, respectively, and may thus be separated from each other. Due to the positive charges in the lower transparent electrode layer 105, negative charges may be read out from the portion of the second photoconductive layer 104 corresponding to the second row of pixels by the data processing unit 200. Then, the read-out negative charges may be subjected to image processing performed by the data processing unit 200.

Thereafter, the same operation as that performed on the first and second rows of pixels may also be performed on a third row of pixels. As a result, negative charges may be read out from a portion of the second photoconductive layer 104 corresponding to the third row of pixels by the data processing unit 200. Then, the read-out negative charges may be subjected to image processing performed by the data processing unit 200.

By performing the above-mentioned operation on all rows of pixels in the PDP 110, it is possible to obtain a radiation image of an object, if any, placed on the apparatus 40.

FIGS. 6A through 6D are cross-sectional views for explaining the operation of another exemplary apparatus 50 for detecting radiation, which includes both a metal layer 103-2 and a dielectric layer 103-2 that serve together as a charge trapping layer. The apparatus 50 is the same as the apparatus 20 shown in FIG. 3 except that it includes the metal layer 103-1 and the dielectric material 103-2 as a charge trapping layer.

Figure 6A:
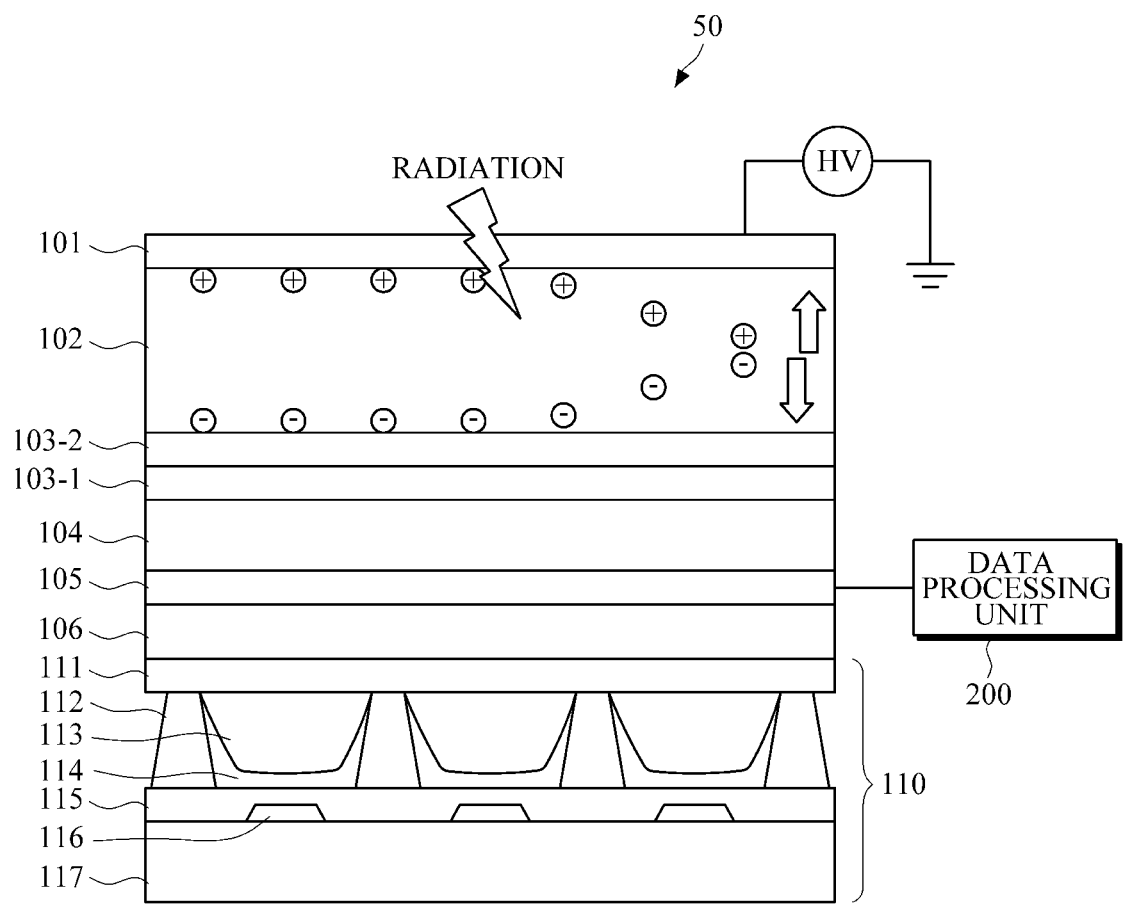
FIGS. 6A through 6D are cross-sectional views for explaining the operation of another exemplary apparatus for detecting radiation, which includes the combination of a metal layer and a dielectric layer as a charge trapping layer.
Figure 6B:
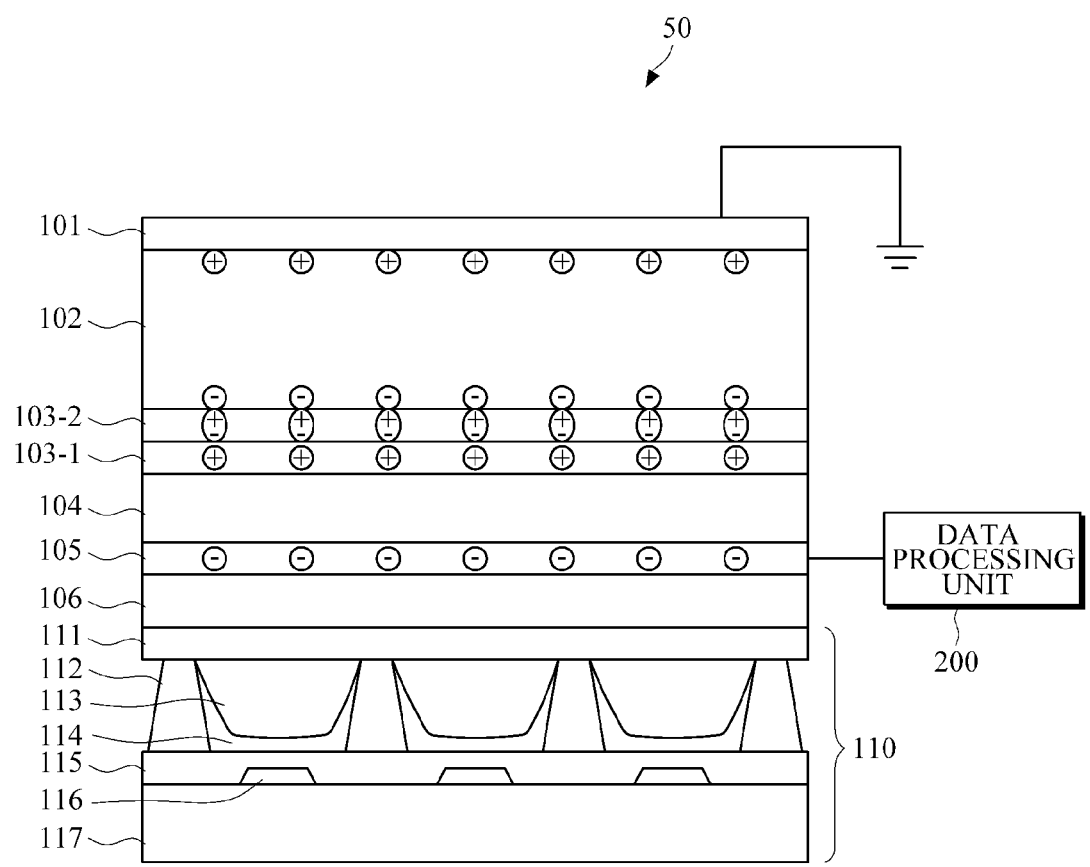

Referring to FIG. 6A, when radiation such as X-rays is applied to the apparatus 50, the radiation may be transmitted to a first photoconductive layer 102 through an upper electrode layer 101, and pairs of positive and negative charges may be generated in the first photoconductive layer 102. When a high voltage HV is applied to the upper electrode layer 101, the positive and negative charges may be separated from each other and may move toward opposite directions. More specifically, if a negative voltage is applied to the first photoconductive layer 102, the positive charges in the first photoconductive layer 102 may move toward the upper electrode layer 101, and the negative charges in the first photoconductive layer 102 may move toward the dielectric layer 103-2.

Due to the movement of the negative charges toward the dielectric layer 103-2, the dielectric layer 103-2 may be polarized, and dipoles may be generated in the dielectric layer 103-2. The dipoles in the dielectric layer 103-2 may be arranged in a manner shown in FIG. 6B.

Due to the pattern of the arrangement of the dipoles in the dielectric layer 103-2, the metal layer 103-1 may be charged with positive charges. A lower transparent electrode layer 105 may be charged with negative charges due to the positive charges in the metal layer 103-1. More specifically, the lower transparent electrode layer 105 may be charged with as many negative charges as there are dipoles in the dielectric layer 103-2.

A radiation image read-out operation will hereinafter be described in detail.

The upper electrode layer 101 may be connected to a ground source. Then, if a first row of pixels in a PDP 110 is turned on, plasma light may be emitted from the first row of pixels. The plasma light may transmit through the lower transparent electrode layer 105 and may thus reach a second photoconductive layer 104.

Figure 6C:
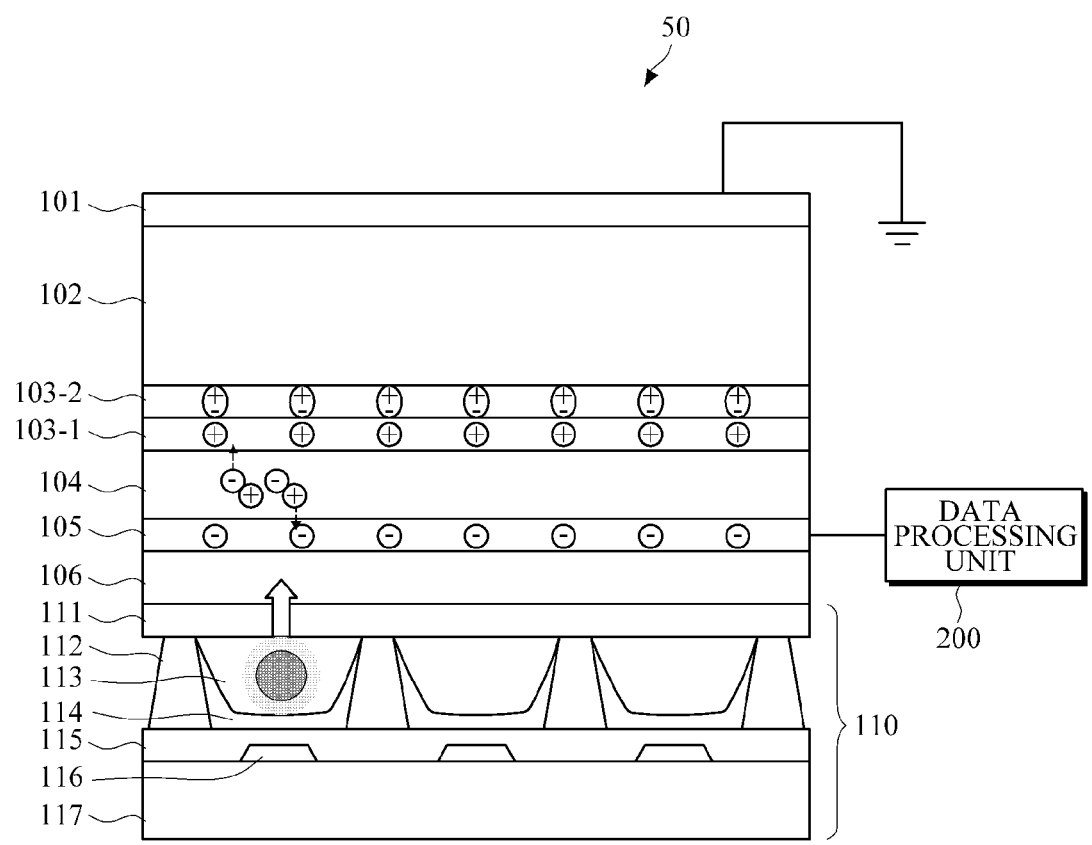

Referring to FIG. 6C, pairs of positive and negative charges may be generated in the second photoconductive layer 104, and particularly, in a portion of the second photoconductive layer 104 corresponding to the first row of pixels, upon exposure to the plasma light emitted from the first row of pixels. The positive and negative charges generated in the second photoconductive layer 104 may be electrically attracted to the metal layer 103-1 and the lower transparent electrode layer 105, respectively, and may thus be separated from each other.

Figure 6D:
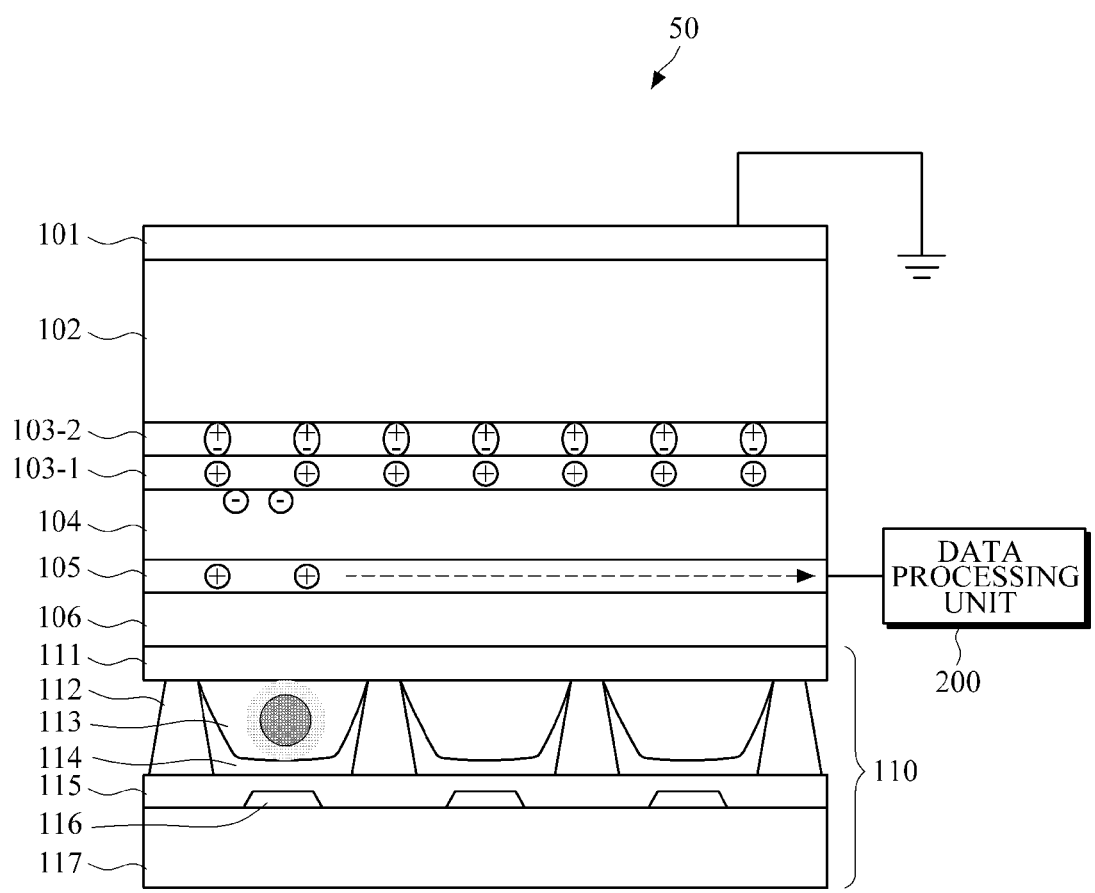

Referring to FIG. 6D, due to the negative charges in the lower transparent electrode layer 105, positive charges may be read out from the portion of the second photoconductive layer 104 corresponding to the first row of pixels by the data processing unit 200. Then, the read-out positive charges may be subjected to image processing performed by the data processing unit 200.

Thereafter, the first row of pixels may be turned off, and a second row of pixels may be turned on. Then, the second row of pixels may emit plasma light. Due to the plasma light, pairs of positive and negative charges may be generated in a portion of the second photoconductive layer 104 corresponding to the second row of pixels. The positive and negative charges generated in the second photoconductive layer 104 may be electrically attracted to the metal layer 103-1 and the lower transparent electrode layer 105, respectively, and may thus be separated from each other. Due to the negative charges in the lower transparent electrode layer 105, positive charges may be read out from the portion of the second photoconductive layer 104 corresponding to the second row of pixels by the data processing unit 200. Then, the read-out positive charges may be subjected to image processing performed by the data processing unit 200.

Thereafter, the same operation as that performed on the first and second rows of pixels may also be performed on a third row of pixels. As a result, positive charges may be read out from a portion of the second photoconductive layer 104 corresponding to the third row of pixels by the data processing unit 200. Then, the read-out positive charges may be subjected to image processing performed by the data processing unit 200.

By performing the above-mentioned operation on all rows of pixels in the PDP 110, it is possible to obtain a radiation image of an object, if any, placed on the apparatus 50.

FIG. 7 is a flowchart of an exemplary method of detecting radiation. Referring to FIG. 7, a high voltage may be applied to the upper electrode layer 101 (710), and radiation may be applied onto the upper electrode layer 101 (720). Pairs of positive and negative charges may be generated in the first photoconductive layer 102 (730). The positive and negative charges may be separated from each other and may move toward the upper electrode layer 101 and the charge trapping layer 103, respectively. As a result, either the positive or negative charges may accumulate in the charge trapping layer 103 (740). More specifically, if a negative voltage is applied to the upper electrode layer 101, negative charges may be trapped in the charge trapping layer 103, and thus, the lower transparent electrode layer 105 may be charged with the opposite polarity to that of the charges trapped in the charge trapping layer 103.

The application of a high voltage to the upper electrode layer may be terminated, and the upper electrode layer 101 may be connected to a ground source (750). Thereafter, if rear light such as plasma light is applied (760), pairs of positive and negative charges may be generated in the second photoconductive layer 104 (770).

Thereafter, a signal corresponding to the charges trapped in the charge trapping layer 103 may be read out from the lower transparent electrode layer 105 due to the positive or negative charges in the second photoconductive layer 104 (780). Thereafter, a radiation image may be generated based on the read-out signal (790).

More specifically, if the charge trapping layer 103 includes a dielectric layer, the charge trapping layer 103 may be polarized due to the positive or negative charges in the first photoconductive layer 102, and thus, dipoles may be generated and arranged in the charge trapping layer 103. Due to the pattern of the arrangement of the dipoles in the charge trapping layer 103, the lower transparent electrode layer 105 may be charged, and thus, the positive or negative charges in the second photoconductive layer 104 may be attracted to the lower transparent electrode layer 105. In this manner, a signal reflecting the arrangement of the dipoles in the charge trapping layer 103 can be read out from the lower transparent electrode layer 105.

Alternatively, if the charge trapping layer 103 includes a dielectric layer and a metal layer and the dielectric layer and the metal layer contact the first photoconductive layer 102 and the second photoconductive layer 104, respectively, the dielectric layer may be polarized due to the positive or negative charges trapped in the charge trapping layer 103, and thus, dipoles may be generated and arranged uniformly in the dielectric layer. The metal layer may be charged according to the pattern of the arrangement of the dipoles in the dielectric layer.

As a result, the lower transparent electrode layer 105 may be charged with the opposite polarity to that of the charges in the metal layer, e.g., positive charges. During a radiation image read-out operation, positive charges generated in the second photoconductive layer 104 upon exposure to rear light may be attracted to the lower transparent electrode layer 105, and thus, a signal reflecting the arrangement of the dipoles in the dielectric layer or corresponding to the charges in the metal layer may be read out from the lower transparent electrode layer 105.

The methods and/or operations described above may be recorded, stored, or fixed in one or more computer-readable storage media that includes program instructions to be implemented by a computer to cause a processor to execute or perform the program instructions. The media may also include, alone or in combination with the program instructions, data files, data structures, and the like. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The described hardware devices may be configured to act as one or more software modules in order to perform the operations and methods described above, or vice versa. In addition, a computer-readable storage medium may be distributed among computer systems connected through a network and computer-readable codes or program instructions may be stored and executed in a decentralized manner.

As described above, it is possible to provide an apparatus and method for detecting radiation, which can improve the resolution of a radiation image and can contribute to the simplification of the manufacture of the apparatus.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An apparatus for detecting radiation, the apparatus comprising:
   an upper electrode layer transmitting radiation;
   a first photoconductive layer becoming photoconductive upon exposure to the radiation and thus generating charges therein;
   a charge trapping layer trapping therein the charges generated in the first photoconductive layer and serving as a floating electrode;
   a second photoconductive layer becoming photoconductive upon exposure to rear light for reading out a radiation image;
   a lower transparent electrode layer charged with the charges trapped in the charge trapping layer; and
   a rear light emission unit applying the rear light to the second photoconductive layer via the lower transparent electrode layer in units of pixels,
   wherein the rear light emission unit comprises two substrates facing each other, a plurality of barrier ribs defining a cell structure between the two substrates, a gas layer disposed in an inner chamber inside the cell structure and emitting plasma light, and a plasma display panel (PDP) providing the plasma light to the lower transparent electrode layer as the rear light.

2. The apparatus of claim 1, further comprising a data processing unit reading out a signal corresponding to the charges trapped in the charge trapping layer from the lower transparent electrode layer and generating a radiation image based on the read-out signal.

3. The apparatus of claim 1, wherein the charge trapping layer includes a metal layer.

4. The apparatus of claim 1, wherein the charge trapping layer includes a dielectric layer.

5. The apparatus of claim 1, wherein the charge trapping layer includes a metal layer and a dielectric layer.

6. The apparatus of claim 1, wherein, during the trapping of charges in the charge trapping layer, a high voltage is applied to the upper electrode layer, and during the reading out of charges from the lower transparent electrode layer, the upper electrode is connected to a ground source.

7. A method of detecting radiation, which is performed by an apparatus for detecting radiation, including an upper electrode layer transmitting radiation, a first photoconductive layer becoming photoconductive upon exposure to the radiation and thus generating charges therein, a charge trapping layer trapping therein the charges generated in the first photoconductive layer and serving as a floating electrode, a second photoconductive layer becoming photoconductive upon exposure to rear light for reading out a radiation image, a lower transparent electrode layer charged with the charges trapped in the charge trapping layer, and a rear light emission unit applying the rear light to the second photoconductive layer via the lower transparent electrode layer in units of pixels, wherein the charge trapping layer includes a metal layer and a dielectric layer, the method comprising:

generating pairs of positive and negative charges in the first photoconductive layer upon exposure to radiation when applying a high voltage to the upper electrode layer;

separating the positive and negative charges from each other and moving the positive and negative charges toward the upper electrode layer and the charge trapping layer, respectively;

trapping the positive or negative charges in the charge trapping layer;

connecting the upper electrode layer to a ground source and generating pairs of positive and negative charges in the second photoconductive layer upon exposure to the rear light; and reading out a signal corresponding to an arrangement of dipoles in the dielectric layer or charges that the metal layer is charged from the lower transparent electrode layer, the charges trapped in the charge trapping layer originating from the second photoconductive layer.

8. The method of claim 7, further comprising generating a radiation image based on the read-out signal.

9. The method of claim 7, wherein the reading out of the signal comprises:

generating and arranging dipoles in the dielectric layer by polarizing the dielectric layer upon the movement of positive or negative charges toward the charge trapping layer; and reading out a signal corresponding to the arrangement of the dipoles in the dielectric layer from the lower transparent layer using the charges transmitted from the second photoconductive layer.

10. The method of claim 7, wherein the reading out of the signal comprises:

if the dielectric layer and the metal layer contact the first and second photoconductive layers, respectively, generating and arranging dipoles in the dielectric layer by polarizing the dielectric layer upon the movement of positive or negative charges toward the charge trapping layer; and charging the metal layer with charges corresponding to the arrangement of the dipoles in the charge trapping layer;

charging the lower transparent layer with an opposite polarity to that of the charges that the metal layer is charged with; and reading out a signal corresponding to the arrangement of the dipoles in the dielectric layer or the charges that the metal layer is charged with from the lower transparent layer.

\* \* \* \* \*